(12) United States Patent
Ambilkar et al.

(10) Patent No.: US 7,535,908 B2
(45) Date of Patent: May 19, 2009

(54) METHOD FOR DATA TRANSFER

(75) Inventors: Shridhar N. Ambilkar, Bangalore (IN);
Girish G. Kurup, Karnataka (IN);
Ashutosh Misra, Karnataka (IN)

(73) Assignee: International Business Machines Corporation, Armonk, NY (US)

( * ) Notice: Subject to any disclaimer, the term of this patent is extended or adjusted under 35 U.S.C. 154(b) by 668 days.

(21) Appl. No.: 11/149,477

(22) Filed: Jun. 9, 2005

(65) Prior Publication Data
US 2007/0011561 A1  Jan. 11, 2007

(51) Int. Cl.
*H04L 12/56* (2006.01)
(52) U.S. Cl. ...................... 370/394; 370/474
(58) Field of Classification Search ............. 714/389, 714/413–419, 428, 474, 535, 537; 370/474, 370/394
See application file for complete search history.

(56) References Cited

U.S. PATENT DOCUMENTS

| | | | |
|---|---|---|---|
| 6,208,645 B1 * | 3/2001 | James et al. ............... 370/389 |
| 6,633,936 B1 | 10/2003 | Keller et al. | |
| 6,717,947 B1 | 4/2004 | Ghodrat et al. | |
| 7,016,304 B2 * | 3/2006 | Chou et al. ............... 370/235 |
| 2002/0172164 A1 | 11/2002 | Chou et al. | |

* cited by examiner

*Primary Examiner*—Derrick W Ferris
*Assistant Examiner*—Stephen W Brown
(74) *Attorney, Agent, or Firm*—Schmeiser, Olsen & Watts; William H. Steinberg

(57) ABSTRACT

A method for data transfer. The method includes: generating a sequence number and storing the sequence number in a retry buffer; generating a cyclic redundancy check remainder; receiving packet data slices of a data packet; in sequence for each packet data slice received, modifying the cyclic redundancy check remainder using a currently received packet data slice and storing the currently received packet data slice in the retry buffer; and after modifying the cyclic redundancy check remainder using a last received packet data slice, storing the last received packet data slice in the retry buffer, modifying the cyclic redundancy check remainder using the last received packet data slice to create a last cyclic redundancy check remainder and storing the last cyclic redundancy check remainder in the retry buffer, the sequence number, the packet data slices and the last cyclic redundancy check remainder comprising a modified data packet.

8 Claims, 5 Drawing Sheets

METHOD FOR DATA TRANSFER

FIELD OF THE INVENTION

The present invention relates to the field of data transmission in a computer network; more specifically, it relates to a method and an apparatus for efficient operation of a layered bus protocol system.

BACKGROUND OF THE INVENTION

A computer network includes two or more computers or other communication devices that are connected with one another so that each computer or device can send and receive information in data packet format from the others. In addition to providing physical connections between computers or devices in the network, a computer network provides a data transmission architecture. Logically, the data transmission architecture can be divided into layers in a layered protocol system, each layer providing a different function. Generally one layer is responsible for adding data checking to data packets so that errors in transmission can be caught and corrected by a retransmission of the data packet.

Conventional methods require the incoming data packet to be latched before it can be processed and thus delay processing of the data packet. Conventional circuit implementations also consume large amounts of silicon area on the integrated circuits chips because of the number of devices required to latch and switch the data packets during processing of the data packet, thus increasing hardware costs.

Therefore, there is a need for a more efficient method and circuit for data packet processing and transmission in a layered protocol system.

SUMMARY OF THE INVENTION

The present invention stores all data packets with appended sequence number and CRC in a retry buffer of a data management layer and passes all data to a physical data layer from the retry buffer both initially and in response to a re-transmission request. Further, the sequence number to be assigned to a next data packet is used to initialize a CRC generator for use with the next data packet.

A first aspect of the present invention is a data management layer of a layered protocol system, comprising: a cyclic redundancy check generator connected to a retry buffer through a multiplexer; a sequence number generator connected to the retry buffer through the multiplexer; means for generating a sequence number cyclic redundancy check remainder connected to preset inputs of a cyclic redundancy check remainder latch of the cyclic redundancy check generator; an input data bus connected directly to the cyclic redundancy check generator and connected to the retry buffer through the multiplexer; and an output data bus directly connected to the retry buffer.

A second aspect of the present invention is a method for data transfer, comprising: providing a cyclic redundancy check generator connected to a retry buffer through a multiplexer; providing a sequence number generator connected to the retry buffer through the multiplexer; generating a sequence number cyclic redundancy check remainder using preset inputs of a cyclic redundancy check remainder latch of the cyclic redundancy check generator; providing an input data bus connected directly to the cyclic redundancy check generator and connected to the retry buffer through the multiplexer; providing an output data bus directly connected to the retry buffer; receiving a data packet on the input bus; adding a sequence number and a cyclic redundancy check remainder to the data packet to create a modified data packet; storing the modified data packet in the retry buffer; and transmitting the modified data packet using the output bus.

A third aspect of the present invention is a method for data transfer, comprising: (a) generating a sequence number and storing the sequence number in a retry buffer; (b) generating a cyclic redundancy check remainder based on the sequence number and initializing a cyclic redundancy check generator using the cyclic redundancy check remainder of the sequence number; (c) receiving packet data slices of a data packet; (d) in sequence for each packet data slice received in step (c), modifying the cyclic redundancy check remainder using a currently received packet data slice and storing the currently received packet data slice in the retry buffer; and (e) after modifying the cyclic redundancy check remainder using a last received packet data slice, storing the last received packet data slice in the retry buffer, modifying the redundancy check remainder using the last received packet data slice to create a last cyclic redundancy check remainder and storing the last cyclic redundancy check remainder in the retry buffer, the sequence number, the packet data slices and the last cyclic redundancy check remainder comprising a modified data packet.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

In describing layered bus protocol systems, different names for the same layer may be used. There are three layers of concern for the present invention. The first layer is the physical layer (also called the physical layer or layer 1 in the International Organization for Standardization (OSI) model). An example of a physical layer protocol is the well-known RS-232. The second layer is the data management layer (also called the link layer or the data link layer or layer 2 in the OSI model). The third layer is the transaction layer (also called the protocol layer or the network layer or layer 3 in the OSI model). Transaction layer protocols are used in controller area network (CAN) bus, asynchronous transfer mode (ATM), and high-level data link control (HDLC). The terms transaction layer, data management layer and physical layer will be used in describing the present invention, but it should be understood that the equivalent terms defined supra may be substituted.

Figure 1:
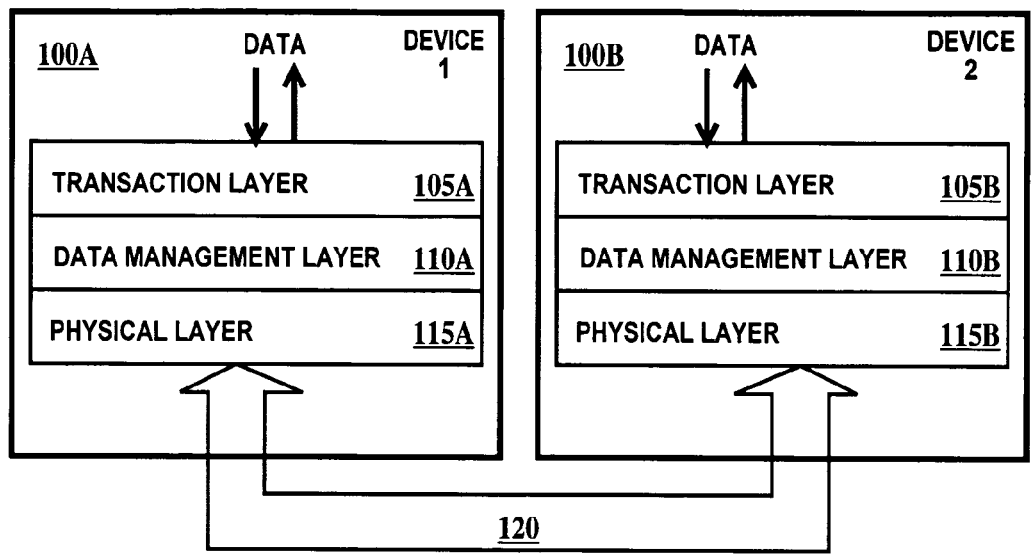
FIG. 1 is a schematic diagram of three interconnected layers of a layered protocol system according to the present invention.

FIG. 1 is a schematic diagram of three interconnected layers of a layered protocol system according to the present invention. In FIG. 1, a first network device 100A includes a transaction layer 105A, a data management layer 110A and a physical layer 115A. A second network device 100B includes a transaction layer 105B, a data management layer 110B and a physical layer 115B. Examples of network devices 100A and 100B include computers, servers and ATM machines. Data are passed from first network device 100A to second network device 100B through a physical connection 120. In one example, physical connection 120 is a network cable. While two network devices are illustrated in FIG. 1, any number of network devices may be connected into a network.

Data must pass through all three layers in sequence within a given network device. Data being received by a network device must pass first through the physical layer, then the data management layer and then the transaction layer. Data being sent by a network device must pass first through the transaction layer, then the data management layer and then the physical layer. It is the data management layer that the present invention is primarily concerned with.

Figure 2:
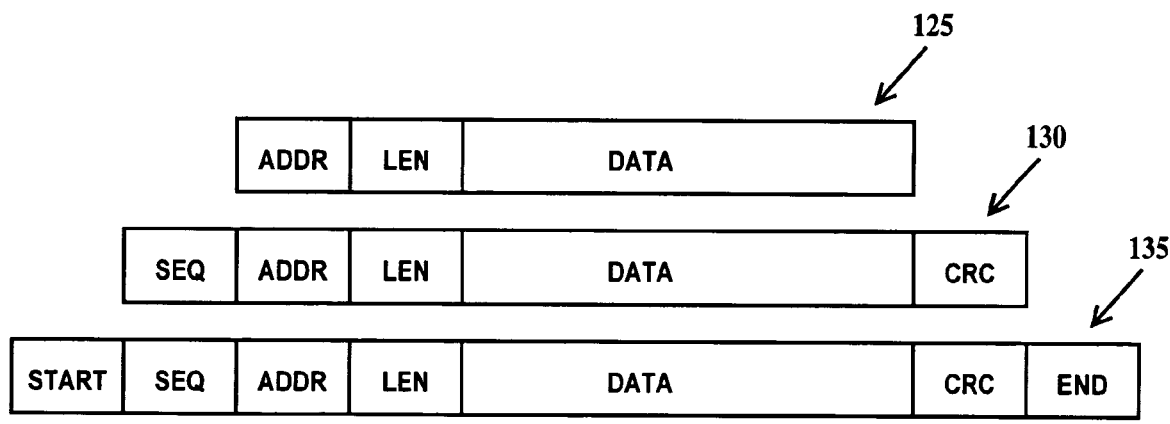
FIG. 2 is a schematic diagram of data packet structure for a layered protocol system according to the present invention.

FIG. 2 is a schematic diagram of data packet structure for a layered protocol system according to the present invention. In FIG. 2, a data packet 125 received from a transaction layer includes address information (ADDR) of the device that is to receive the data packet, length of the data packet (LEN) information and the data itself (DATA). The data management layer assigns and appends a sequence number (SEQ) before the ADDR and generates and appends a cyclic redundancy check (CRC) remainder (often abbreviated to simply CRC in the literature) after the DATA of data packet 125 to create a modified data packet 130. The physical layer appends a start of packet flag (START) before the SEQ and appends an end of packet flag (END) after the CRC remainder of modified data packet 130 to create a final data packet 135.

Figure 3:
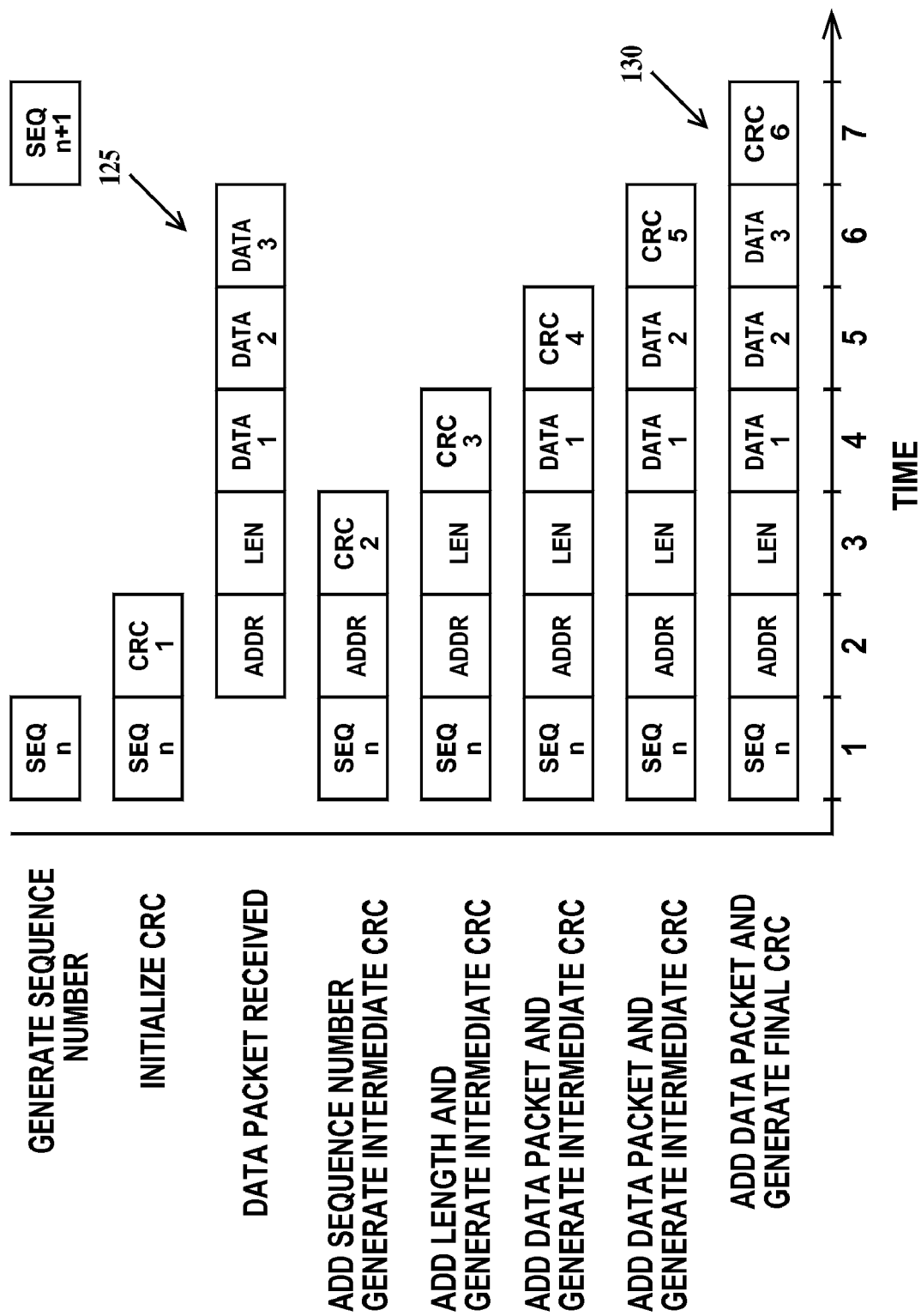
FIG. 3 is a timing diagram illustrating addition of error-checking information to a data packet according to the present invention.

FIG. 3 is a timing diagram illustrating addition of error-checking information to a data packet according to the present invention. The time axis is divided into equal units of time. Data packet 125 is divided into equal sized (number of bits) packet data slices corresponding to the amount of data that can be transferred from the transaction layer and processed by the data management layer in one unit of time. The amount of data that can be transferred in a unit of time is a function of hardware bus bit-widths and operating frequency. In FIG. 3, ADDR and LEN of data packet 125 each take up one packet data slice while the actual data (DATA, see FIG. 2) of the data packet takes up 3 data slices, DATA 1, DATA 2 and DATA 3. The maximum number of bits per packet data slice is a function of the bit-width of the buses of the hardware. For example, with a bus width of 64 bits (or 128 bits) and each time unit representing one clock cycle, each packet data slice contains 64 bits (or 128 bits) of data and 64 bits (or 128 bits) of data packet 125 are transferred and processed every clock cycle. ADDR, LEN, DATA 1, DATA 2 and DATA 3 may be padded to fill a packet data slice if there are an insufficient number of bits in the actual information to use all of the available bit positions in a packet data slice.

In a first time period the next or nth sequence number (SEQ n) (the sequence number to be appended to data packet 125 as modified data packet 130 is assembled) and a CRC remainder based on SEQ n generated in the data management layer. The CRC remainder based on SEQ is used to initialize a CRC generator is labeled (CRC 1) and is used in the next CRC cycle (in a second time period). The sequence CRC remainder may be generated in software or hardware in a sequence number generator and is not generated by actually running the sequence number through a CRC generator since the algorithm of the CRC generator is known. Sequence numbers and sequence number CRC remainders can be determined any time before the second time period, that is any time before an ADDR packet data slice of the next data packet is received. Sequence number SEQ n is shown available in the first time period before ADDR as this is the latest that generation of SEQ n can occur. SEQ n+1 is shown generated in the seventh time period though it can be generated earlier. CRC remainder generation is illustrated in FIGS. 4 and 5 and discussed infra.

In the second time period, the data management layer receives an ADDR packet data slice of data packet 125 and uses ADDR to generate a second CRC remainder (CRC 2), which is used in the next CRC cycle (in a third time period). In the third time period, the data management layer receives a LEN packet data slice of data packet 125 and uses the LEN to generate a third CRC remainder (CRC 3), which is used in the next CRC cycle (in a fourth time period). In the fourth time period, the data management layer receives the DATA 1 packet data slice of data packet 125 and uses the DATA 1 to generate a fourth CRC remainder (CRC 4), which is used in the next CRC cycle (in a fifth time period). In the fifth time period, the data management layer receives the DATA 2 packet data slice of data packet 125 and uses the DATA 2 to generate a fifth CRC remainder (CRC 5), which is used in the next CRC cycle (in a sixth time period). In the sixth time period, the data management layer receives the DATA 3 packet data slice of data packet 125 and uses the DATA 3 to generate a last CRC remainder (CRC 6) which, is appended to modified data packet 130 in a seventh time period. Also in the seventh time period, the n+1 sequence number (SEQ n+1) is generated for the next data packet.

Figure 4:
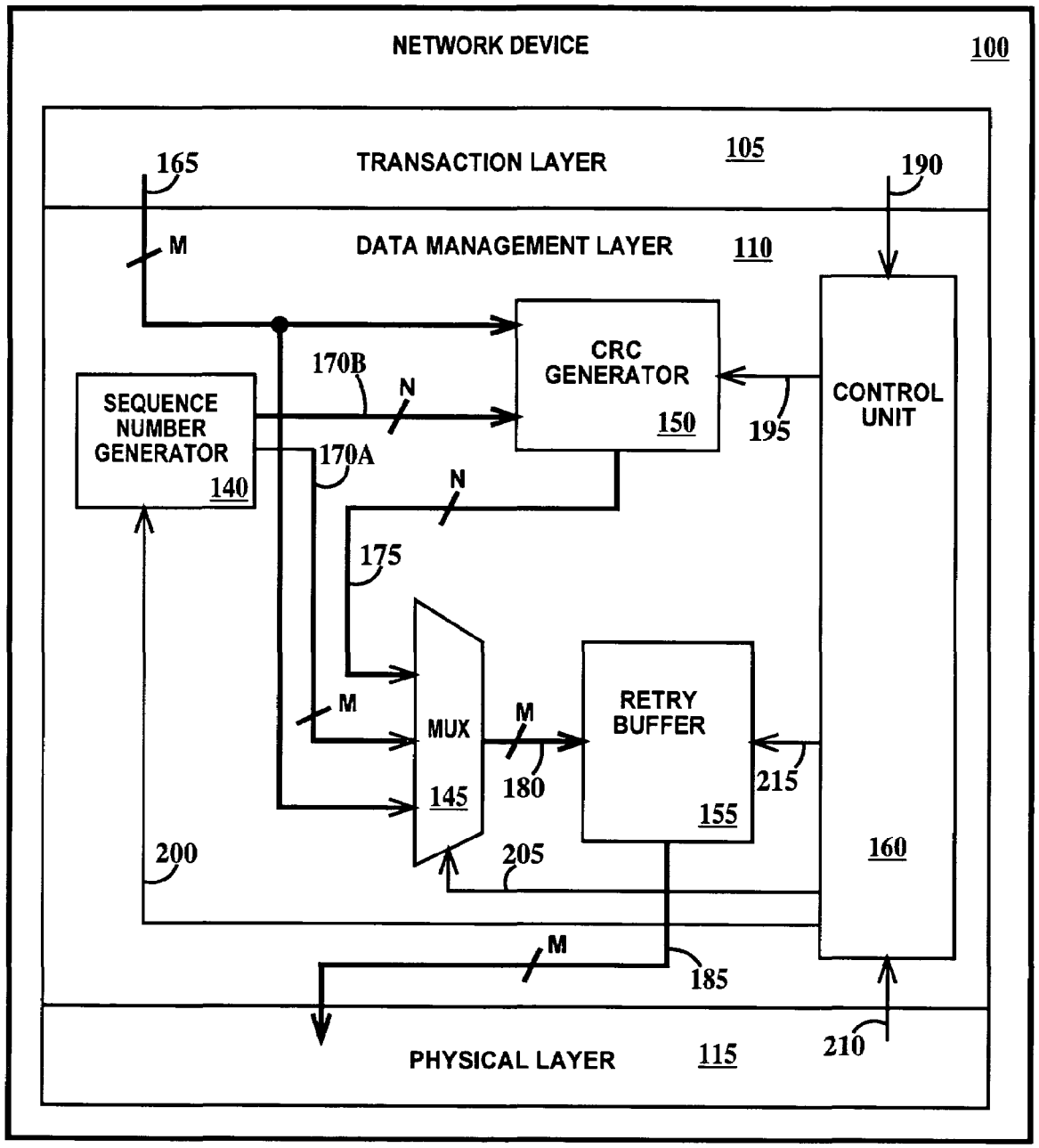
FIG. 4 is a block schematic circuit diagram of a data management layer according to the present invention.
Figure 5:
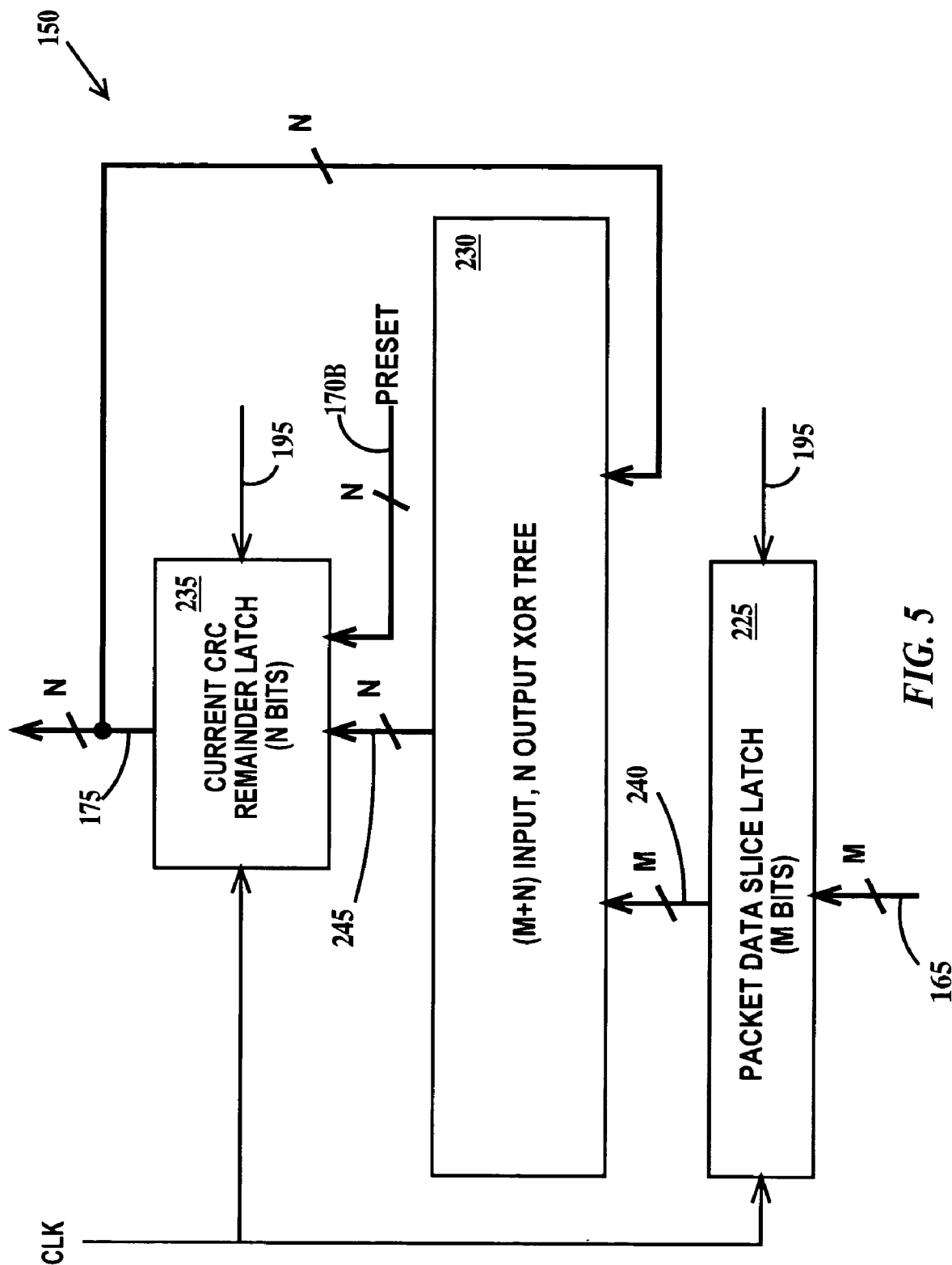
FIG. 5 is a block schematic circuit diagram of a cyclic redundancy checker (CRC) according to the present invention.

FIG. 4 is a block schematic circuit diagram of a data management layer according to the present invention. In FIG. 4, a network device 100 includes a transaction layer 105, a data management layer 110 and a physical layer 115. Data management layer 110 includes a sequence number generator 140, a multiplexer 145 (labeled MUX), a CRC generator 150, a retry buffer 155 and a control unit 160. Sequence number generator 140 includes either a circuit for generating sequence number cyclic redundancy check remainders or accesses a computer algorithm for calculating sequence number cyclic redundancy check remainders. In one example, retry buffer 155 is an addressable memory cell array. Two types of addressable memory array cells suitable for use with the present invention are static random access memory (SRAM) cells and dynamic random access memory (DRAM) cells.

Data packets are received from transaction layer 105 via an M-bit input bus 165 which is connected to data inputs of CRC generator 150 and a to a first set of selectable inputs of multiplexer 145. In one example, M is 64 or 128. Sequence number generator 140 is connected to a second set of selectable inputs of multiplexer 145 by an M-bit sequence number bus 170A. Sequence number generator 140 is also connected to preset inputs of CRC generator 150 by a N-bit preset bus 170B. An output of CRC generator 150 is connected to a third set of selectable inputs of multiplexer 145 by an N-bit CRC remainder bus 175. An output of multiplexer 145 is connected to an input of retry buffer 155 by an M-bit memory bus 180. An output of retry buffer 155 is connected to physical layer 115 by an M-bit output bus 185.

In operation, control unit 160 receives a new data packet signal 190 from transaction layer 105 and generates a CRC control signal 195 sent to CRC generator 150 and a new sequence number signal 200 sent to sequence number generator 140. Sequence number generator 140 then sends a sequence number to multiplexer 145 on sequence number bus 170A and sends a sequence number CRC remainder to preset latches of CRC generator 150 on preset bus 170B. Alternatively, both the sequence number and sequence number CRC remainder may be generated in advance, with the sequence number sent to retry buffer 155 and the sequence number CRC remainder sent to CRC generator 150 at a time after the completion of reception of a previous data packet. Control unit 160 also generates a MUX select signal 205 sent to multiplexer 145. At this time MUX select signal is set to pass sequence number data on bus 170A to retry buffer 155 via bus 180.

Next, in turn ADDR, LEN and DATA 1 to DATA X (where X is the number of packet data slices DATA is divided into) packet data slices are sent in sequence to CRC generator 150 and multiplexer 145, with MUX select signal 205 set to select input bus 165 in order to send ADDR, LEN or DATA 1 to DATA X to retry buffer 155 via bus 180. In this way a modified data packet (except for the CRC remainder) is built up in retry buffer 155 and the CRC remainder is continuously updated but not transmitted to the retry buffer.

Finally, a last CRC remainder is generated after the DATA X packet data slice has been processed by CRC generator 150 and stored in retry buffer 155, the last CRC remainder is sent to the retry buffer by setting the MUX select signal 205 to select bus 175. The data management layer data packet assembly is now complete and a completed modified data packet comprising sequence number, address, length, data and CRC remainder is stored in retry buffer 155.

Control unit 160 receives control signals 210 from physical layer 115 and sends a data select/action signal 215 to retry buffer 155 based on the information in control signals 210. Upon a SEND control signal from physical layer 115, retry buffer 155 will send a requested modified data packet from the retry buffer to the physical layer via bus 185. Upon receipt of an ACK control signal, (acknowledging receipt of a sent modified data packet without errors) the corresponding modified data packet is removed from retry buffer 155. Upon receipt of a NACK signal (acknowledging receipt of a sent modified data package with errors) the corresponding modified data packet is resent from retry buffer 155 to physical layer 115 via bus 185.

FIG. 5 is a block schematic circuit diagram of CRC 150 generator according to the present invention. In FIG. 5, CRC generator 150 includes an (M+N)-bit packet data slice latch 225, a single, M-bit input/N-bit output XOR tree 230 and an N-bit current CRC remainder latch 235. The bit width of the remainder latch defines the CRC type, in the present example, an N-bit CRC. Inputs of packet data slice latch 225 are connected to input bus 165.

Each output of packet slice latch 225 is connected to a single and different input of XOR tree 230 by an M-bit bus 240. Current CRC remainder latch 235 has dual selectable inputs. A first set of inputs of current CRC remainder latch 235 is connected to a bus 245 and a second set of inputs of current CRC remainder latch 235 is connected to N-bit preset bus 170B. Each output of XOR tree 230 is connected to a single and different input of current CRC remainder latch 235 by bus 245. Thus, XOR tree 230 is an (M+N) input, N output XOR tree. The output of current CRC remainder latch 235 is connected to CRC remainder bus 175, each bit of which is also connected to a single and different input of XOR tree 230 then the bits of bus 240 are connected to XOR tree 230 in order to provide the cyclic portion of the CRC remainder.

Data bits are moved from packet data slice latch 225 through XOR tree 230 and current CRC remainder latch 235 by a clock signal CLK. The same CLK signal moves data bits out of current CRC remainder latch 235 onto CRC output bus 175 and into XOR tree 230. However, only the last CRC remainder is actually stored in retry buffer 155 (see FIG. 4) because multiplexer 145 (see FIG. 4) gates the CRC remainder on CRC remainder bus 175. The arrangement of XOR gates in XOR tree 230 implements the CRC code and performs the actual CRC calculation.

CRC generator 150 is initialized by latching the CRC remainder of the sequence number of the next data packet into current CRC remainder latch 235 via preset bus 170B.

Figure 6:
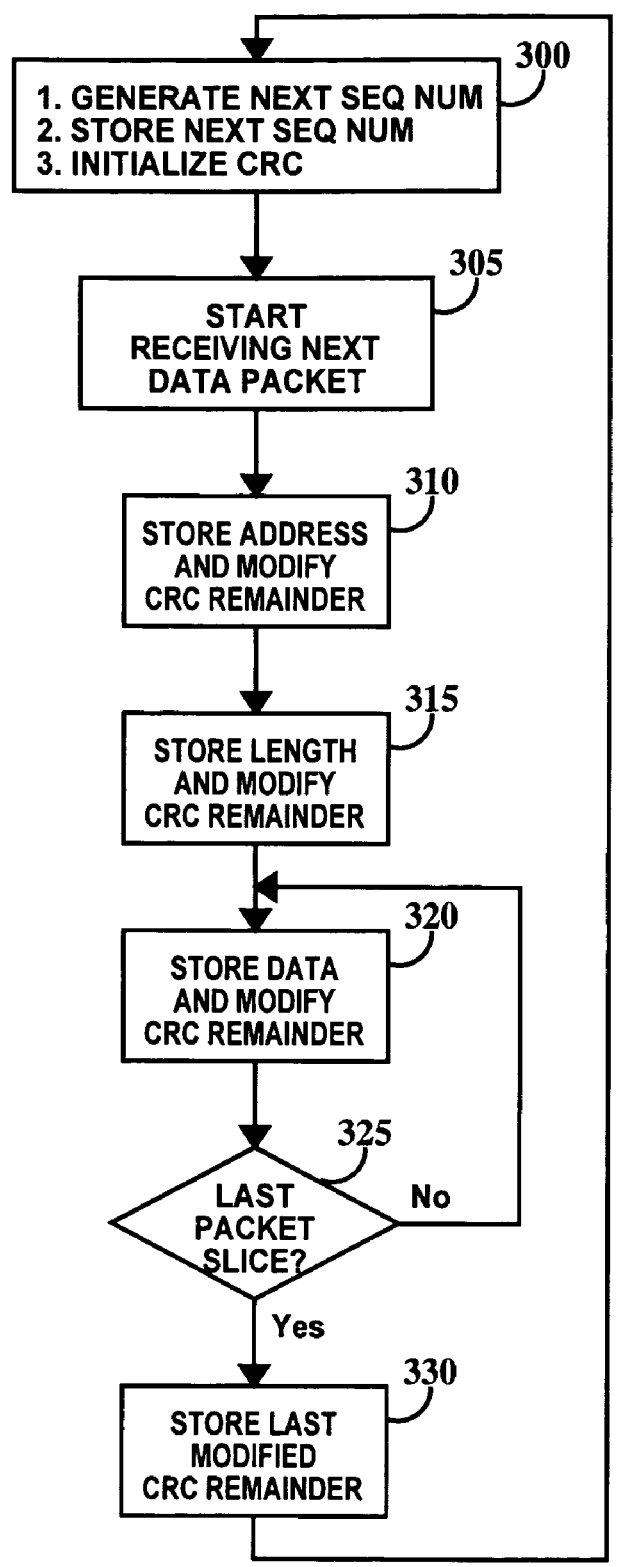
FIG. 6 is a flowchart of the method for adding error-checking information to data packets according to the present invention.

FIG. 6 is a flowchart of the method for adding error-checking information to data packets according to the present invention. Reference to FIG. 4 may be useful in reference to the description of FIG. 6 infra.

In step 300, first the sequence number and a CRC remainder of the sequence number for the next data packet is generated before the start of reception of the next data packet. The sequence number for the next data packet is the current sequence number+1. Generation of the sequence number and sequence number CRC remainder for the next data packet can occur any time during reception of the current data packet. Second, multiplexer 145 (see FIG. 4) is set to select sequence number bus 170A (see FIG. 4) and the sequence number of the next data package is stored in retry buffer 155 (see FIG. 4) any time after the CRC remainder for the current data package has been stored in the retry buffer. Third, the sequence number CRC remainder for the next data packet is latched into the preset inputs of CRC generator 150 (see FIG. 4) to initialize the CRC generator.

Step 305 does not start until transaction layer 105 (see FIG. 4) sends a start of packet notification to data management layer 110 (see FIG. 4). This sets multiplexer 145 (see FIG. 4) to select input bus 165 (see FIG. 4). In step 305, reception of the data packet starts.

In step 310, as the address packet data slice is received, the address packet is stored in retry buffer 155 (see FIG. 4) and received by the packet data slice latch of CRC generator 150 (see FIG. 4) and CRC remainder is modified. The CRC remainder is not stored in retry buffer 155 (see FIG. 4) because multiplexer 145 (see FIG. 4) is set to select data packets not CRC remainders.

In step 315, as the length packet data slice is received, the length packet is stored in retry buffer 155 (see FIG. 4) and received by the packet data slice latch of CRC generator 150 (see FIG. 4) and the CRC remainder is modified. The CRC remainder is not stored in retry buffer 155 (see FIG. 4) because multiplexer 145 (see FIG. 4) is set to select data packets not CRC remainders.

In step 320, as the first/next data packet data slice is received, the first/next data packet data slice is stored in retry buffer 155 (see FIG. 4) and received by the packet data slice latch of CRC generator 150 (see FIG. 4) and the CRC remainder is modified. The CRC remainder is not stored in retry buffer 155 (see FIG. 4) because multiplexer 145 (see FIG. 4) is set to select data packets not CRC remainders.

In step 325, it is determined if the current data packet data slice is the last data packet data slice. Transaction layer 105 (see FIG. 4) sends an end of data packet notification after the last packet data slice has been sent. If in step 325, the current data packet data slice is the last data packet data slice (an end the packet a notification has been received), the method proceeds to step 330, otherwise the method will loop back to repeat step 320.

In step 330, multiplexer 145 (see FIG. 4) is set to select CRC remainder bus 175 (see FIG. 4) and the last CRC remainder (the CRC remainder modified using the last data packet data slice) is stored in retry buffer 155 (see FIG. 4). The sequence number, the address packet data slice, the length packet data slice, the data packet data slices and the last CRC remainder comprise a modified data packet which is stored in retry buffer 155 (see FIG. 4). Then the method returns to step 300 to prepare for the next data packet.

Modified data packets are transmitted from retry buffer 155 (see FIG. 4) to physical layer 115 (see FIG. 4) on output bus 185 (see FIG. 4) when requests are received from the physical layer by data management layer 110 (see FIG. 4).

Thus the present invention provides an efficient method and circuit for data packet processing and transmission in a layered protocol system.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for data transfer, comprising:
    (a) generating a sequence number and storing said sequence number in a retry buffer;
    (b) generating a cyclic redundancy check remainder based on said sequence number and initializing a cyclic redundancy check generator using said cyclic redundancy check remainder of said sequence number;
    (c) receiving packet data slices of a data packet;
    (d) in sequence for each packet data slice received in step (c), modifying said cyclic redundancy check remainder using a currently received packet data slice and storing said currently received packet data slice in said retry buffer; and
    (e) after modifying said cyclic redundancy check remainder using a last received packet data slice, storing said last received packet data slice in said retry buffer, modifying said cyclic redundancy check remainder using said last received packet data slice to create a last cyclic redundancy check remainder and storing said last cyclic redundancy check remainder in said retry buffer, said sequence number, said packet data slices and said last cyclic redundancy check remainder comprising a modified data packet.

2. The method for data transfer of claim 1, further including:
    (f) transmitting said modified data packet to a layer of a layered protocol system only from said retry buffer.

3. The method for data transfer of claim 2, further including:
    after step (f), (g) re-transmitting said modified data packet from said retry buffer upon receipt of a signal indicating an error in reception of said modified data packet by said layer of said layered protocol system.

4. The method of claim 2, further including:
    after step (f), (g) removing said modified data packet from said retry buffer upon receipt of a signal indicating a successful reception of said modified data packet by said layer of said layered protocol system.

5. The method for data transfer of claim 2, wherein in step (f), said modified data packet is transmitted to a physical layer of said layered protocol system.

6. The method for data transfer of claim 1, wherein in step (c), said packet data slices of said data packet are received from a transaction layer of a layered protocol system.

7. The method for data transfer claim 1, wherein each data packet slice of said data packet slices comprises an address packet data slice, a length packet data slice and one or more data packet data slices.

8. The method for data transfer claim 1, wherein said retry buffer is an addressable memory cell array.

* * * * *